(12) United States Patent
McGarvey

(10) Patent No.: US 11,876,109 B2
(45) Date of Patent: Jan. 16, 2024

(54) SEMICONDUCTOR DEVICES WITH SINGLE-PHOTON AVALANCHE DIODES AND LIGHT SPREADING LENSES

(71) Applicant: SEMICONDUCTOR COMPONENTS INDUSTRIES, LLC, Phoenix, AZ (US)

(72) Inventor: Brian Patrick McGarvey, Templemartin (IE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 535 days.

(21) Appl. No.: 16/868,040

(22) Filed: May 6, 2020

(65) Prior Publication Data

US 2021/0351222 A1 Nov. 11, 2021

(51) Int. Cl.
*H01L 27/146* (2006.01)
*H01L 31/0232* (2014.01)
*H01L 31/107* (2006.01)
*H01L 31/02* (2006.01)

(52) U.S. Cl.
CPC .. *H01L 27/14643* (2013.01); *H01L 27/14627* (2013.01); *H01L 31/02327* (2013.01); *H01L 31/107* (2013.01); *H01L 31/02027* (2013.01)

(58) Field of Classification Search
None
See application file for complete search history.

(56) References Cited

U.S. PATENT DOCUMENTS

| 2011/0240865 | A1 | 10/2011 | Frach et al. |
| 2012/0186077 | A1* | 7/2012 | Hwu ............... H01L 25/0753 29/825 |
| 2013/0015331 | A1 | 1/2013 | Birk et al. |

(Continued)

FOREIGN PATENT DOCUMENTS

| CA | 3038038 | * | 3/2018 | ............ G01J 1/02 |
| DE | 102015102631 A1 | | 8/2016 | |
| WO | WO2018/218298 | * | 6/2018 | .......... H01L 27/146 |

OTHER PUBLICATIONS

Rasshofer et al. "Automotive Radar and Lidar Systems for Next Generation Driver Assistance Functions." Advances in Radio Science, 3, 205-209, 2005.

(Continued)

*Primary Examiner* — Alexander G Ghyka
(74) *Attorney, Agent, or Firm* — Treyz Law Group, P.C.; Joseph F. Guihan

(57) ABSTRACT

An imaging device may include single-photon avalanche diodes (SPADs). The single-photon avalanche diodes may be arranged in a one-dimensional or two-dimensional array in a SPAD-based semiconductor device. The SPAD-based semiconductor device may also include a transparent cover glass that is formed over the array of SPADs. Each line of SPADs within the SPAD-based semiconductor device may be covered by a respective light spreading lens. The light spreading lens may be formed as a groove in an upper surface of the transparent cover glass. The light spreading lens may have a uniform cross-section along its length. The light spreading lens may be formed as a convex lens on an upper or lower surface of the transparent cover glass.

20 Claims, 12 Drawing Sheets

(56) References Cited

U.S. PATENT DOCUMENTS

2013/0153975 A1 6/2013 Henseler et al.
2013/0313414 A1 11/2013 Pavlov et al.
2016/0181459 A1 6/2016 Birk et al.

OTHER PUBLICATIONS

Pavia et al. "Measurement and modeling of microlenses fabricated on single-photon avalanche diode arrays for fill factor recovery." Optics express; 2014.

* cited by examiner

SEMICONDUCTOR DEVICES WITH SINGLE-PHOTON AVALANCHE DIODES AND LIGHT SPREADING LENSES

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices, on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
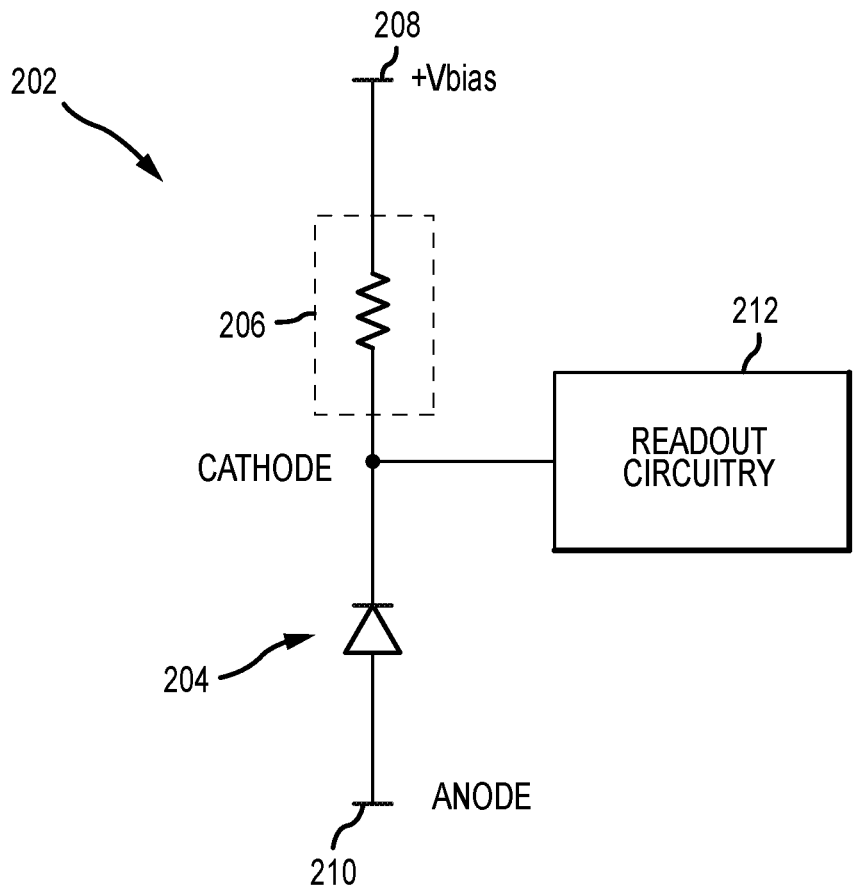
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
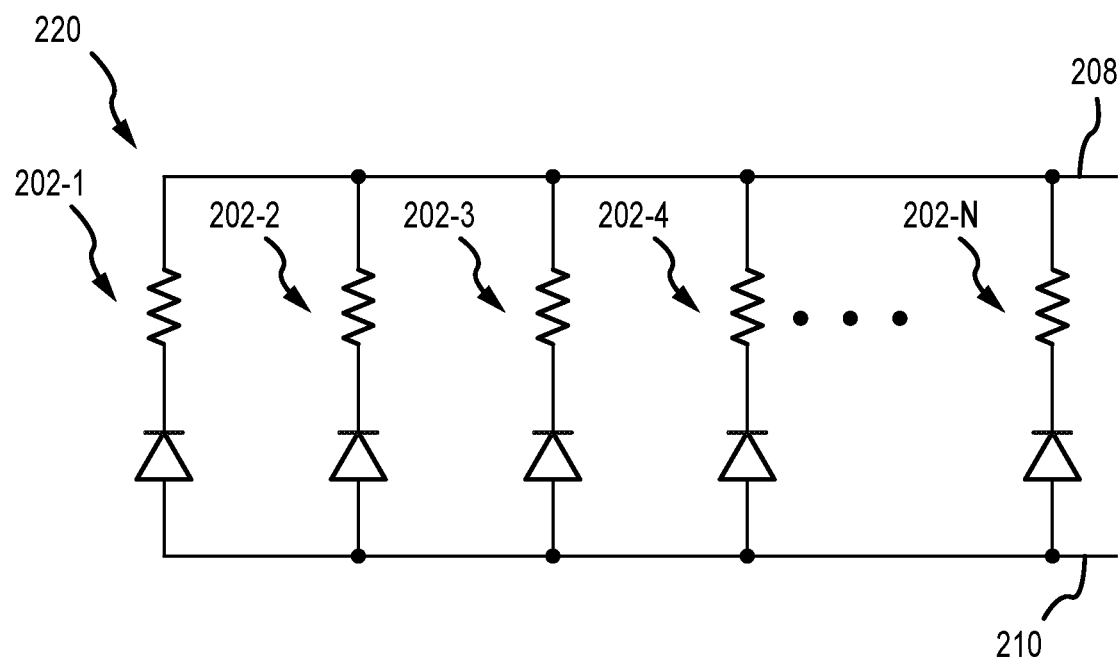
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
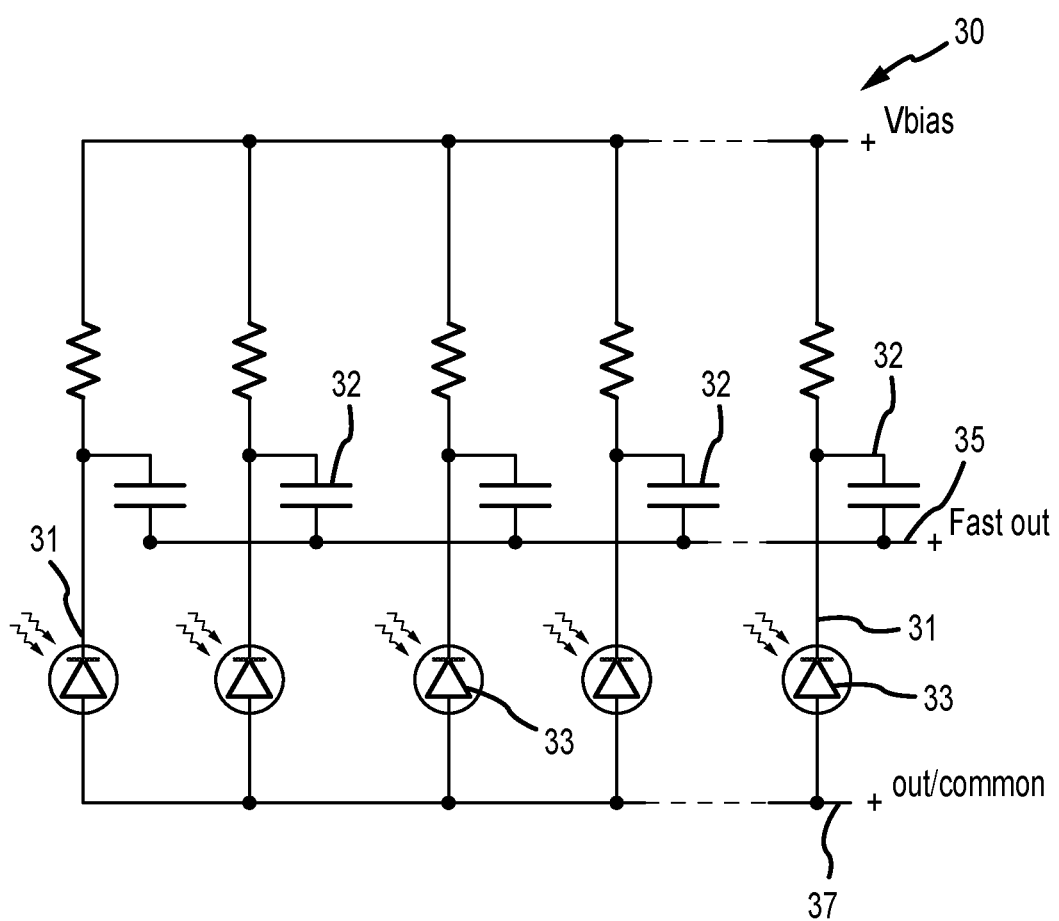
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
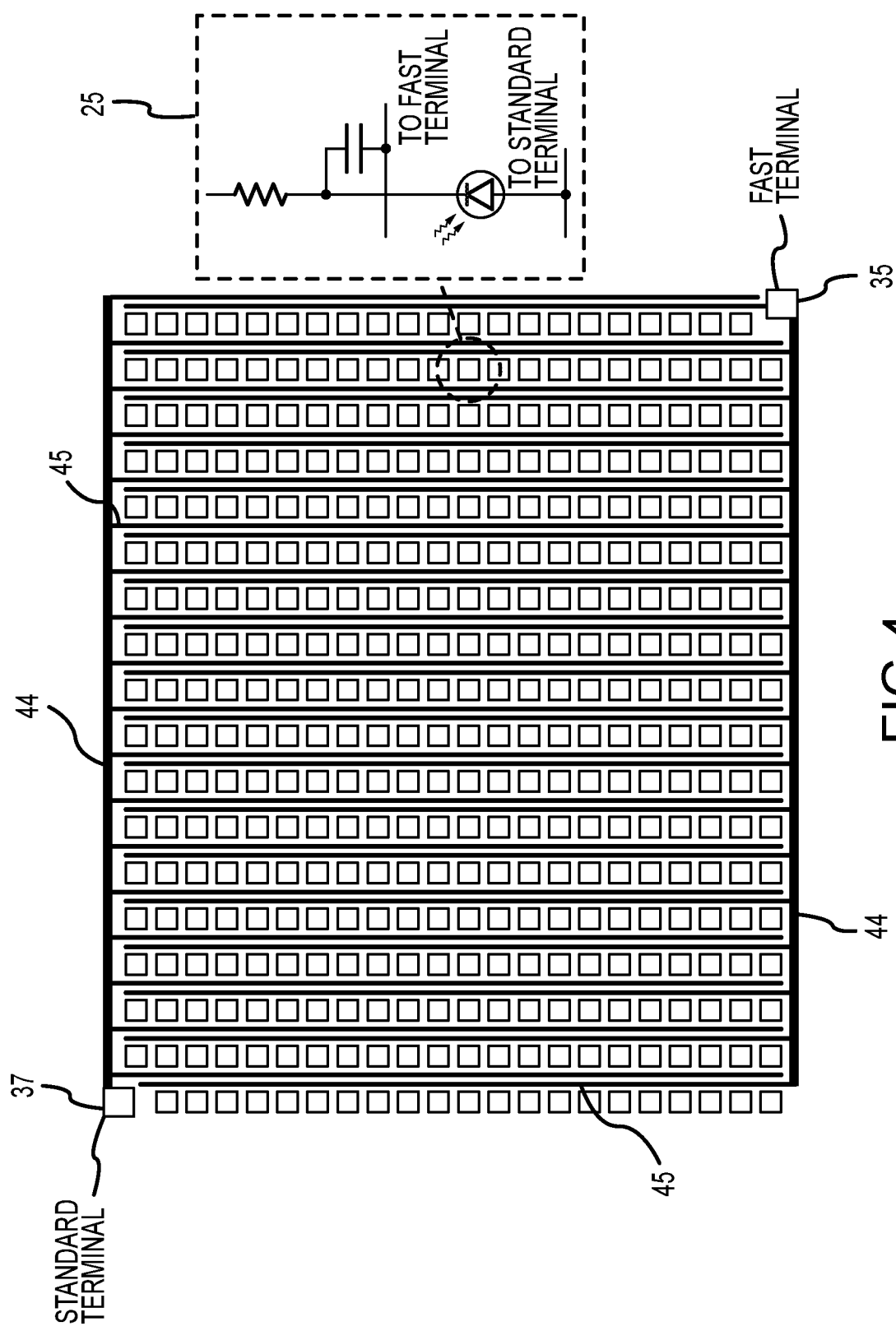
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
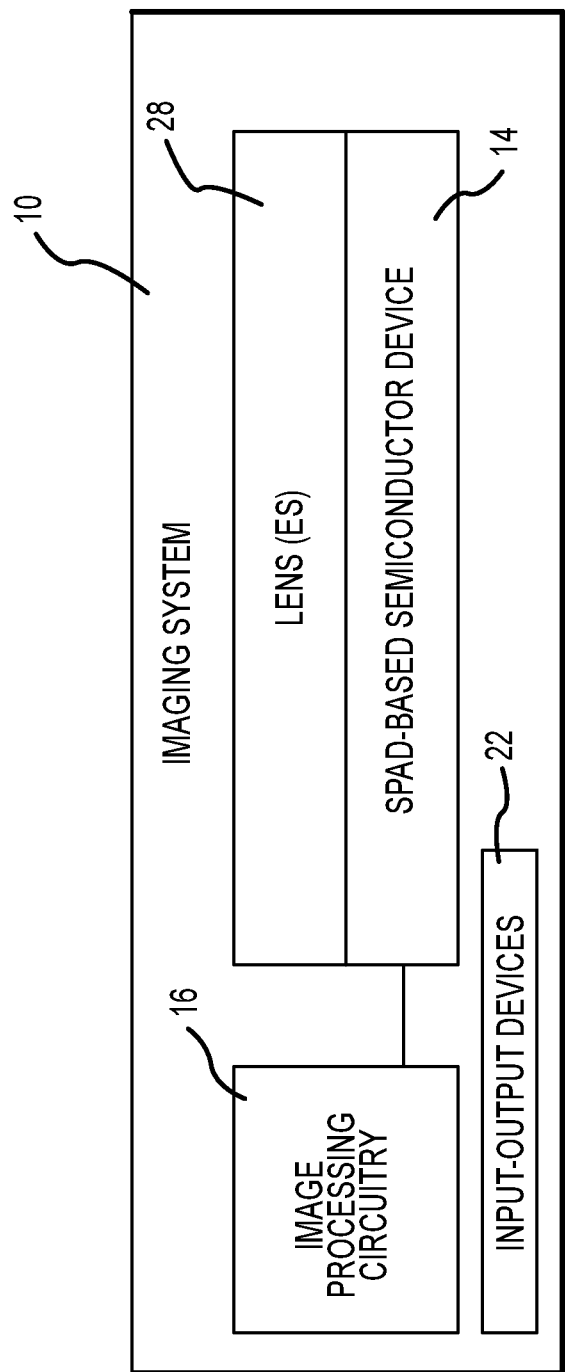
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component (such as a laser) may be included in the imaging system to emit light (e.g., infrared light or light of any other desired type). Semiconductor device 14 may measure the reflection of the light off of an object to measure distance to the object in a LIDAR (light detection and ranging) scheme.

Figure 6:
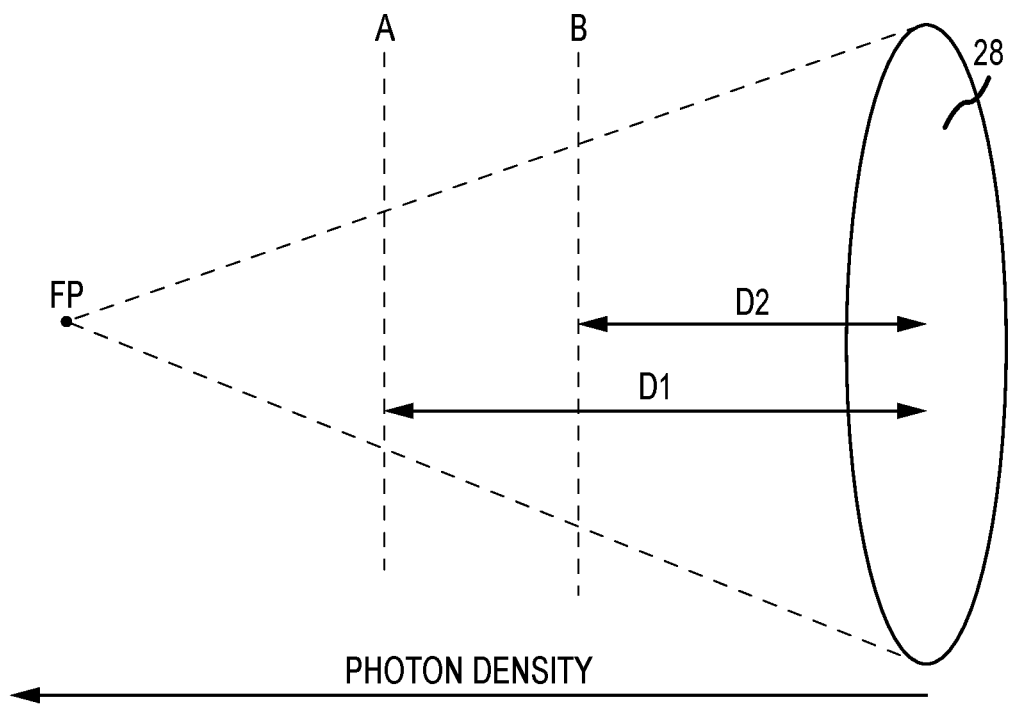
FIG. 6 is a side view of an illustrative imaging system showing how a lens may focus light onto a SPAD-based semiconductor device in accordance with an embodiment.

FIG. 6 is a side view showing how a lens may focus light onto a SPAD-based semiconductor device. As shown, lens 28 may focus incoming light onto a focal point FP. The SPAD-based semiconductor device may be positioned between the lens and the focal point, with the received photon density increasing with increased distance from the lens. Consider the two extreme options as an example. Immediately adjacent to the lens, the light has not been focused much and is therefore still spread over a large area. The photon density is therefore low. In contrast, at the focal point, the incident light has been focused to a much small area. The photon density is therefore high. At high photon densities, the SPAD-based semiconductor device may saturate at lower than desired light levels, resulting in a low dynamic range.

Keeping in mind these principles, consider possible positions for the SPAD-based semiconductor device 14 relative to lens 28. At position A, the SPAD-based semiconductor device 14 may be separated from the lens by a distance D1. At position B, the SPAD-based semiconductor device may be separated from the lens by a distance D2. At position A, the photon density will be higher than at position B. This may undesirably reduce the dynamic range of the SPAD-based semiconductor device, because the SPAD-based semiconductor device will saturate at lower illumination levels. In addition to lowering the dynamic range, saturation is also undesirable for causing a baseline shift of the SPAD-based semiconductor device.

Baseline shift refers to a phenomenon that occurs when a SPAD-based semiconductor device is exposed to light levels much greater than the saturation level. In these conditions, charge carriers may be trapped in the semiconductor substrate (e.g., silicon) of the device. The charge carriers are then slowly released, causing a baseline shift current which may take time to dissipate.

To increase the saturation level of the SPAD-based semiconductor device, the device may be moved closer to the lens (e.g., to position B instead of position A). The SPAD-based semiconductor device will have a higher saturation point (and therefore, higher dynamic range) at position B than at position A.

However, forming the SPAD-based semiconductor device closer to lens 28 may require the SPAD-based semiconductor device to have a high aspect ratio (e.g., with long and narrow SPAD-based devices). Manufacturing SPAD-based semiconductor devices of the appropriate aspect ratio may be difficult. Additionally, in a given system, the distance between the SPAD-based semiconductor device and the lens may be fixed (e.g., due to other design constraints within the system). In situations such as these, it may be desirable to have an alternate method to increase the saturation point and dynamic range of the SPAD-based semiconductor device.

Figure 7:
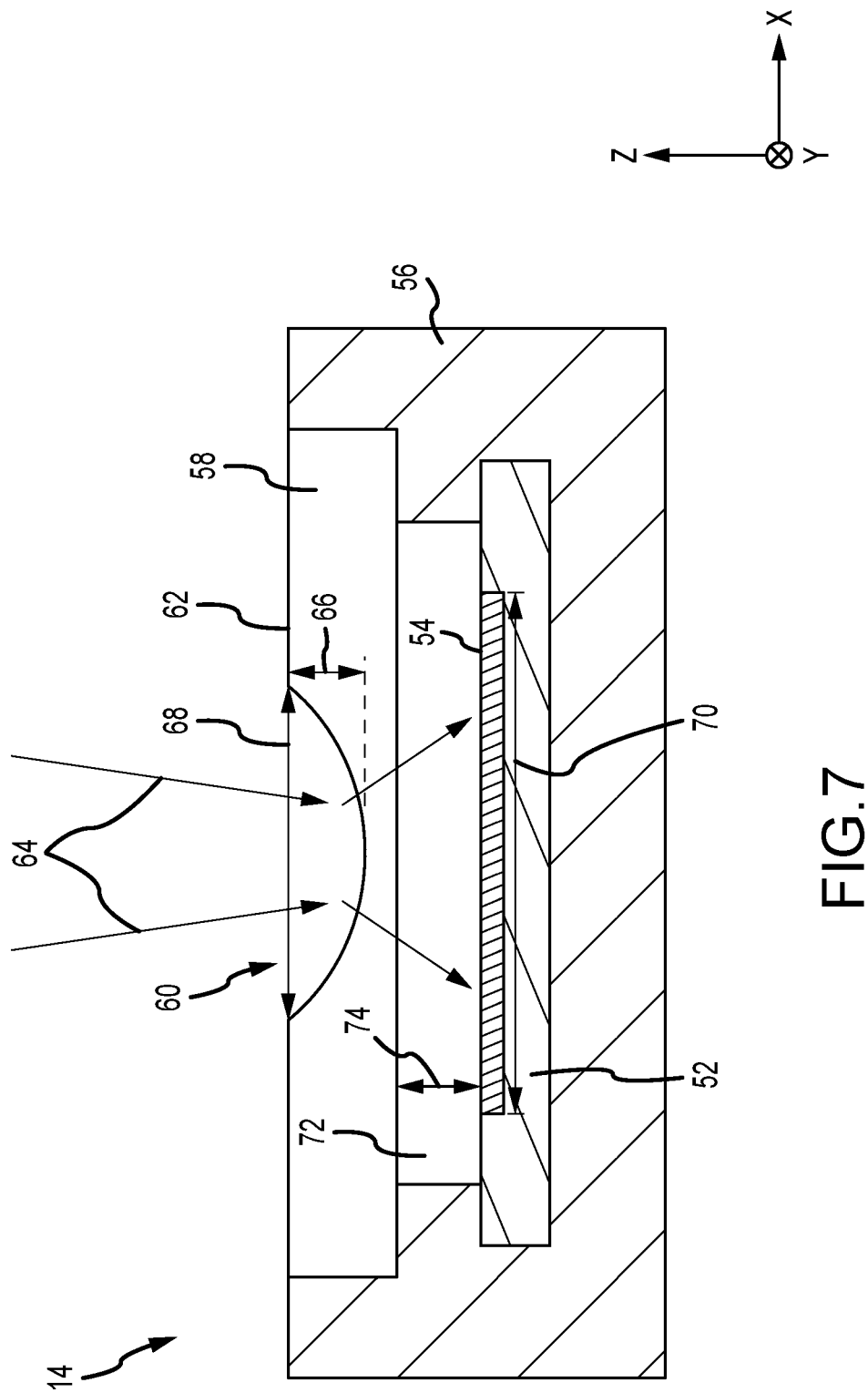
FIG. 7 is a cross-sectional side view of an illustrative SPAD-based semiconductor device that includes a concave light spreading lens in accordance with an embodiment.

To reduce the photon density without moving the SPAD-based semiconductor device closer to lens 28, one or more light spreading lenses may be incorporated onto the SPAD-based semiconductor device. FIG. 7 is a cross-sectional side view of a SPAD-based semiconductor device of this type.

As shown in FIG. 7, SPAD-based semiconductor device 14 includes a semiconductor substrate 52 with an active photosensitive area 54. Semiconductor substrate 52 may be formed from any desired semiconductor material (e.g., silicon). Active photosensitive area 54 may be formed from a doped portion of the semiconductor substrate and may include one or more single-photon avalanche diodes. The SPADs in the active area may be arranged in a one-dimensional (1D) or two-dimensional (2D) array. In embodiments where the SPAD-based semiconductor device has a 1D array of SPADs, the SPAD-based semiconductor device may be referred to as a line array. FIG. 7 shows an example of a line array.

A package 56 is included to hold the semiconductor substrate 52 and active photosensitive area 54. Package 56 may be formed from any desired package material (e.g., glass, plastic, ceramic, etc.). Package 56 (sometimes referred to as package material 56, package structure 56, etc.) supports and holds the semiconductor substrate for the SPAD-based semiconductor substrate. Input-output contacts may be provided on and/or through the package material if desired.

The SPAD-based semiconductor device also includes a transparent cover 58. Transparent cover 58 may be formed from a transparent material such as glass or plastic. Transparent cover 58 may transmit more than 90% of incident light, more than 95% of incident light, more than 99% of incident light, etc. Transparent cover 58 may sometimes be referred to as glass cover 58, transparent cover layer 58, cover layer 58, lid 58, etc. Transparent cover 58 may sometimes be referred to as forming a portion of a package for the device (e.g., transparent cover 58 forms a first portion of the package and package material 56 forms a second portion of the package).

A light spreading lens may be incorporated into the transparent cover. As shown in FIG. 7, a light spreading lens 60 is incorporated into transparent cover 58. In FIG. 7, the light spreading lens is formed as a concave recess in an upper surface 62 of the transparent cover layer. As shown by arrows 64, incident light may be defocused by the concave light spreading lens to spread the light over a larger area. In other words, lens 60 receives incident light distributed over a first surface area (and width) and spreads the light onto the active area distributed with a second, larger surface area (and width).

Spreading the light with lens 60 lowers the photon density of the light received by the SPADs, which increases the saturation level and dynamic range of the SPAD-based semiconductor device. Incorporating lens 60 for light spreading also reduces baseline shift in the device.

In the example of FIG. 7, lens 60 is formed as a concave groove on the upper surface of glass layer 58. The groove may have a depth 66. Depth 66 may be any desired distance (e.g., more than 10 microns, more than 20 microns, more than 30 microns, more than 40 microns, more than 50 microns, more than 100 microns, less than 100 microns, less than 50 microns, less than 40 microns, between 15 and 50 microns, between 40 microns, etc.). The groove may have a width 68. Width 68 may be any desired distance (e.g., more than 50 microns, more than 100 microns, more than 150 microns, more than 200 microns, less than 200 microns, less than 150 microns, less than 100 microns, between 50 and 250 microns, between 150 and 200 microns, etc.). The ratio of width 68 to height 66 may be any desired ratio (e.g., more than 2, more than 3, more than 5, more than 10, less than 10, between 3 and 5, between 2 and 10, etc.).

Active area 54 has a width 70. Width 70 may be more than 100 microns, more than 150 microns, more than 200 microns, more than 300 microns, more than 400 microns, less than 500 microns, between 150 and 500 microns, between 200 and 300 microns, etc. The ratio of width 70 to width 68 is indicative of the amount that the incident light is spread by light spreading lens 60. The ratio of width 70 to width 68 may be more than 1, more than 1.5, more than 2, more than 3, more than 4, between 1 and 4, etc.

Active area 54 is separated from a lower surface of glass layer 58 by air gap 72 (sometimes referred to as void 72, air-filled void 72, air-filled gap 72, etc.). Air gap 72 has a thickness 74 of any desired distance (e.g., more than 10 microns, more than 20 microns, more than 30 microns, more than 40 microns, more than 50 microns, more than 100 microns, less than 100 microns, less than 50 microns, less than 40 microns, 20 and 100 microns, between 40 and 80 microns, etc.). In FIG. 7, void 72 is filled with air. However, another filler material (e.g., a low-index polymer) may be used to fill the void instead if desired. One or more microlenses may also be present between active area 54 and glass layer 58. The microlenses may be formed on a surface of the semiconductor substrate over the active area.

Figure 8A:
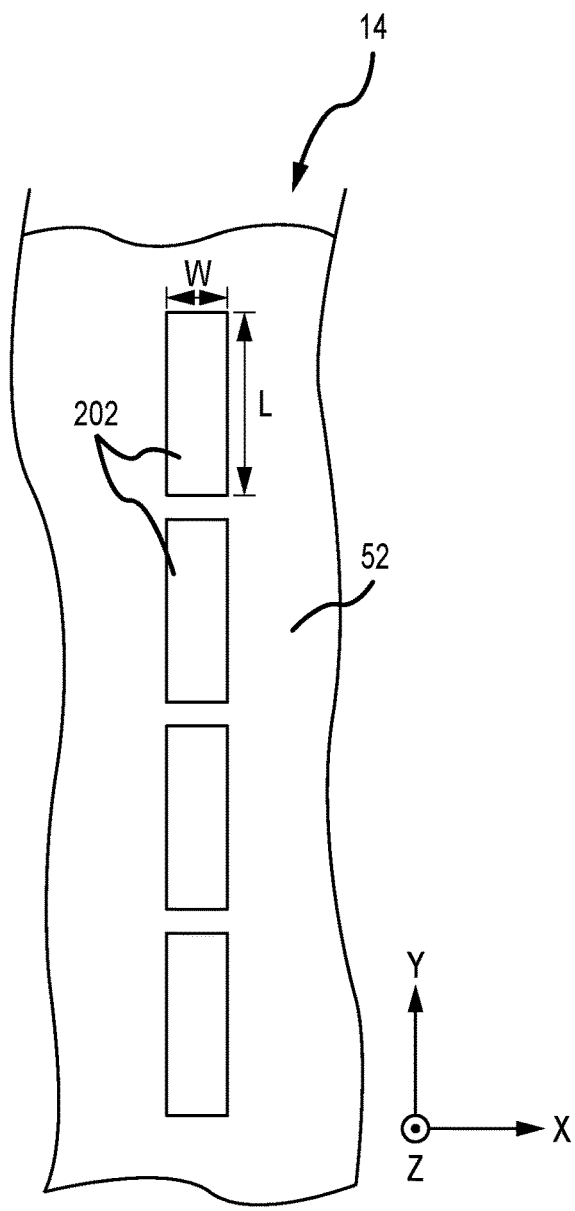
FIGS. 8A and 8B are top views of illustrative one-dimensional line arrays with and without a light spreading lens in accordance with an embodiment.
Figure 8B:
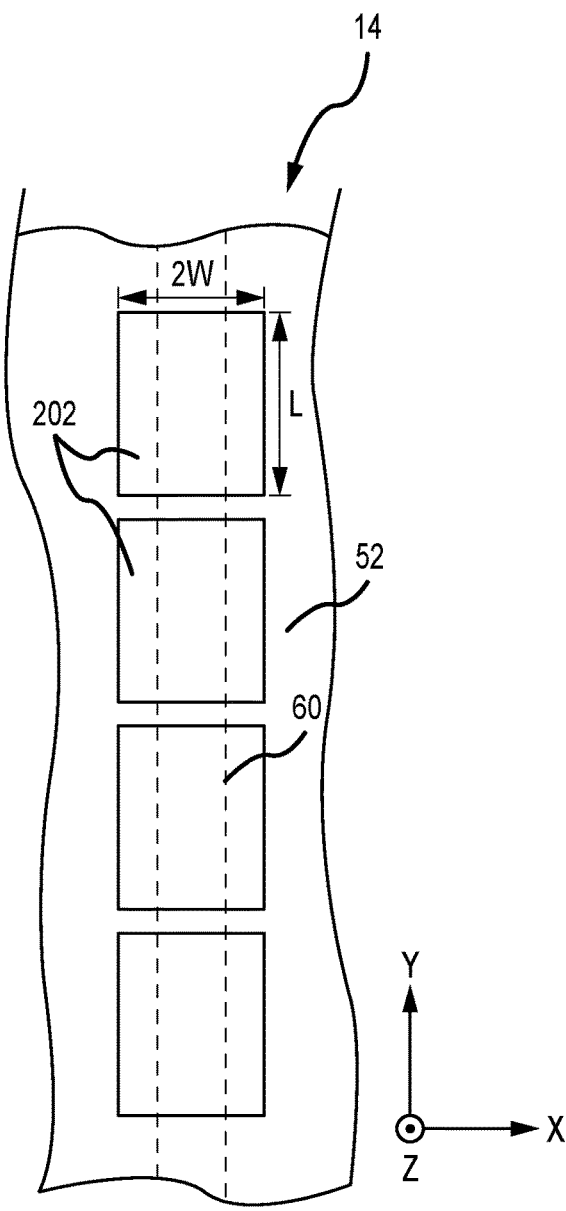

FIGS. 8A and 8B are top views of a SPAD-based semiconductor device showing how the light spreading lenses may be used to increase the saturation level of the device. FIG. 8A shows an example where the light spreading lens is not included in the SPAD-based semiconductor device 14. As shown, each SPAD 202 (which are used to form the active area 54 in substrate 52) has a respective width W and length L. In FIG. 8B, light spreading lens 60 is formed over the SPADs. Consequently, each SPAD has a width 2 W (e.g., twice as wide as in FIG. 8A) and a length L. This shows how the presence of the light spreading lens enables the SPADs to receive light over a larger area, thereby reducing the photon density of the received light, increasing the saturation level and dynamic range, and reducing baseline shift.

As shown in FIG. 8B, the light spreading lens 60 may extend parallel to a line (e.g., column or row) of SPADs 202. The light spreading lens may be a continuous groove in the glass layer having a uniform cross-section across all of the SPADs that it overlaps. The light spreading lens 60 extends parallel to a line of SPADs in the Y-direction and spreads light in the X-direction. The light spreading lens 60 may spread light in only the X-direction (e.g., without spreading light in the Y-direction) or may spread light more in the X-direction than in the Y-direction. The light spreading lens extends along a longitudinal axis that is parallel to the Y-axis. In other words, the light spreading lens has a width and a length that is longer than the width, with the length extending parallel to the Y-axis.

Figure 8C:
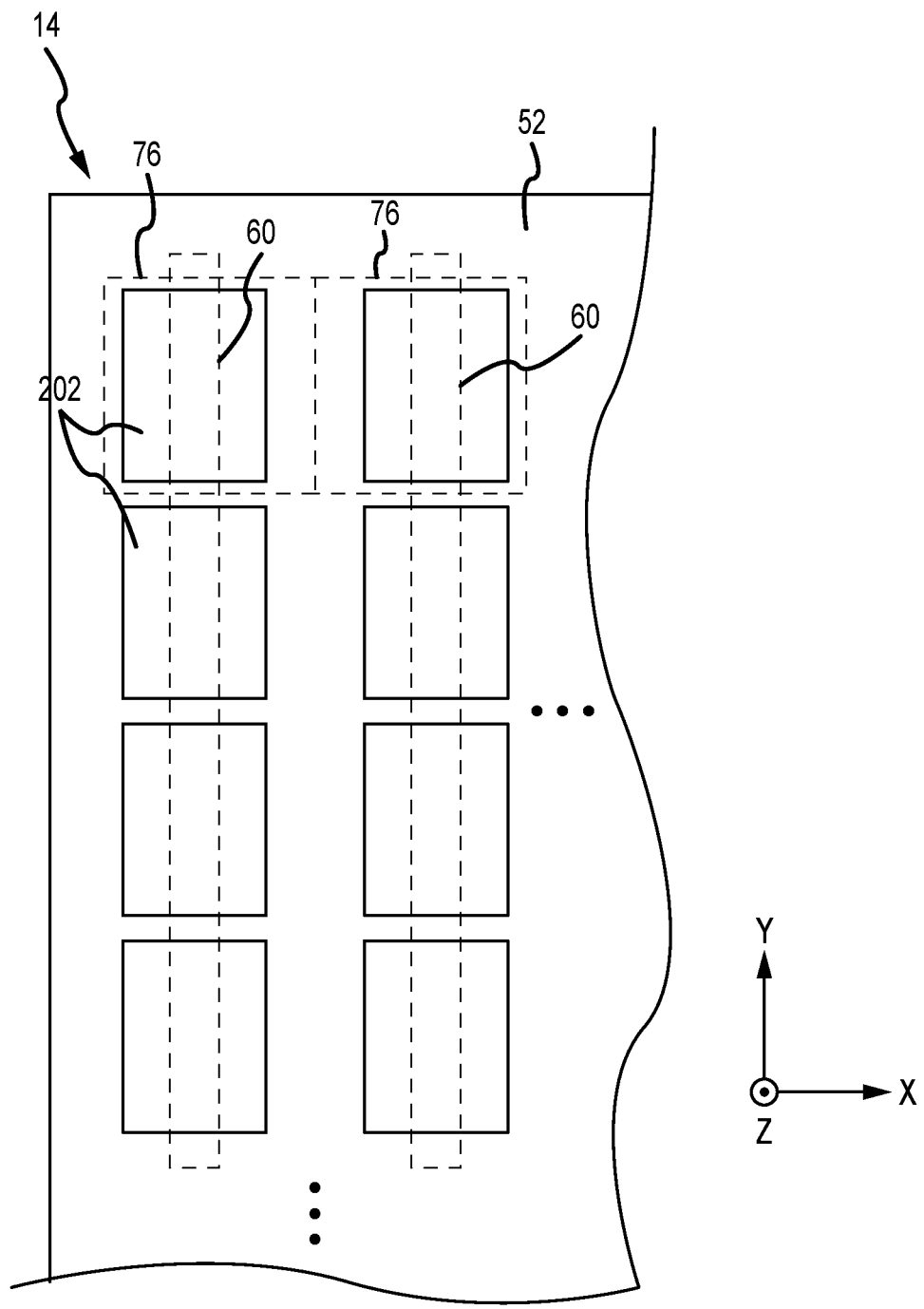
FIG. 8C is a top view of an illustrative two-dimensional SPAD array that includes light spreading lenses in accordance with an embodiment.

FIG. 8B shows an example where the SPAD-based semiconductor device is a line array. In other embodiments, the SPAD-based semiconductor device may be a 2D array of SPADs. FIG. 8C is a top view of an illustrative SPAD-based semiconductor device with a two-dimensional array of SPADs. As shown, each line (e.g., column) of SPADs may have a corresponding light spreading lens 60. Each light spreading lens may extend in the Y-direction and may overlap a corresponding column of SPADs. The presence of the light spreading lens enables the SPADs to receive light over a larger area, as discussed above in connection with FIG. 8B.

FIG. 8C shows how the SPAD-based semiconductor device may also optionally include microlenses 76. The microlenses 76 may each cover a respective SPAD 202 and may focus light onto a corresponding SPAD to mitigate cross-talk. Each microlens may focus light primarily in one direction (e.g., only in the X-direction or more in the X-direction than in the Y-direction) or may focus light equally in multiple directions (e.g., in the Y-direction and in the X-direction).

Figure 9:
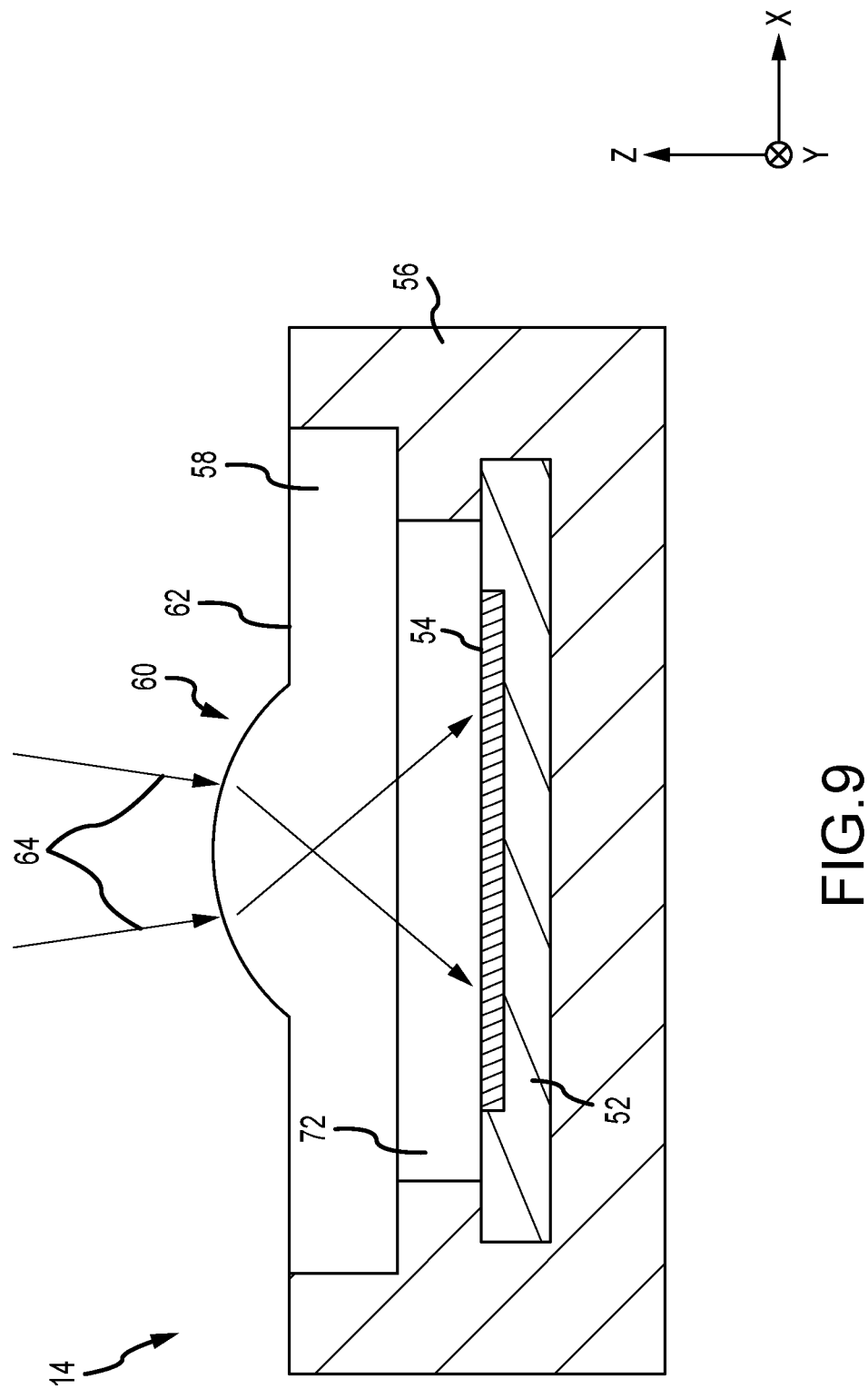
FIG. 9 is a cross-sectional side view of an illustrative SPAD-based semiconductor device that includes a convex light spreading lens in accordance with an embodiment.

The example in FIG. 7 of the light spreading lens being formed from a concave groove in the upper surface of the glass layer 58 is merely illustrative. Other types of lenses may be used for the light spreading lens if desired. FIG. 9 is a cross-sectional side view of an illustrative SPAD-based semiconductor device that includes a convex lens on an upper surface of the glass layer.

As shown in FIG. 9, SPAD-based semiconductor device 14 includes a semiconductor substrate 52 with an active area 54 that is held by package 56 and covered by glass layer 58. In FIG. 9, however, light spreading lens 60 is formed by a convex lens on the upper surface 62 of glass layer 58. The convex light spreading lens in FIG. 9 may be formed from the same material as transparent cover 58. For example, the convex light spreading lens may be formed from glass and may be integral with the glass cover 58. In another possible embodiment, the convex light spreading lens may be formed from a different material than cover 58 that is formed on the upper surface 62 of cover 58 (e.g., in direct contact with the upper surface of cover 58).

Convex light spreading lens 60 may have a focal length selected such that incident light (shown by arrows 64) is focused to a focal point then spreads back out by the time the light reaches active area 54. In this way, the desired light spreading properties are achieved using lens 60. The focal length may be selected to be less than half of the distance between the upper surface of cover 58 and the active area.

Figure 10:
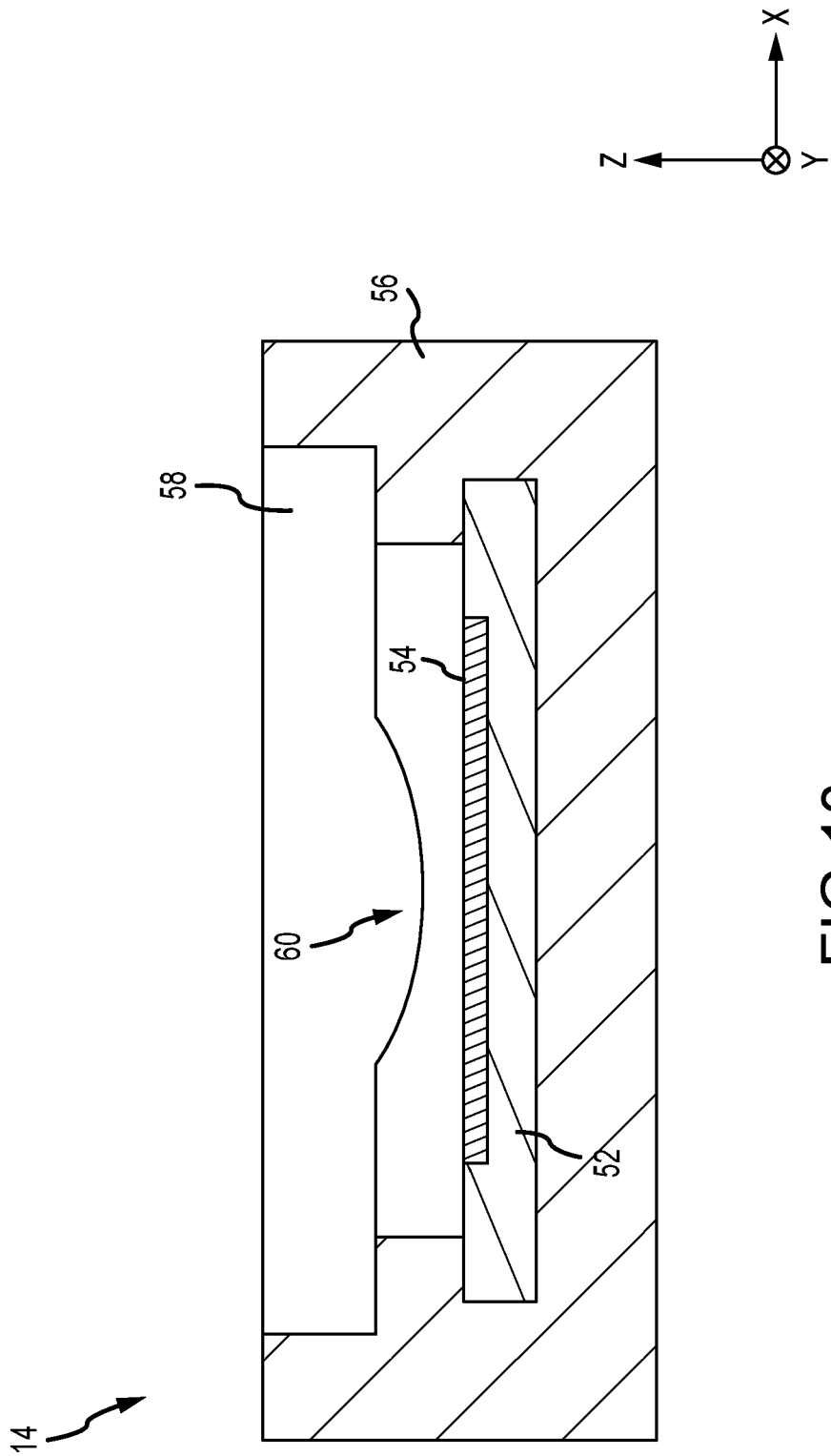
FIG. 10 is a cross-sectional side view of an illustrative SPAD-based semiconductor device that includes a convex light spreading lens on a lower surface of a transparent cover in accordance with an embodiment.
Figure 11:
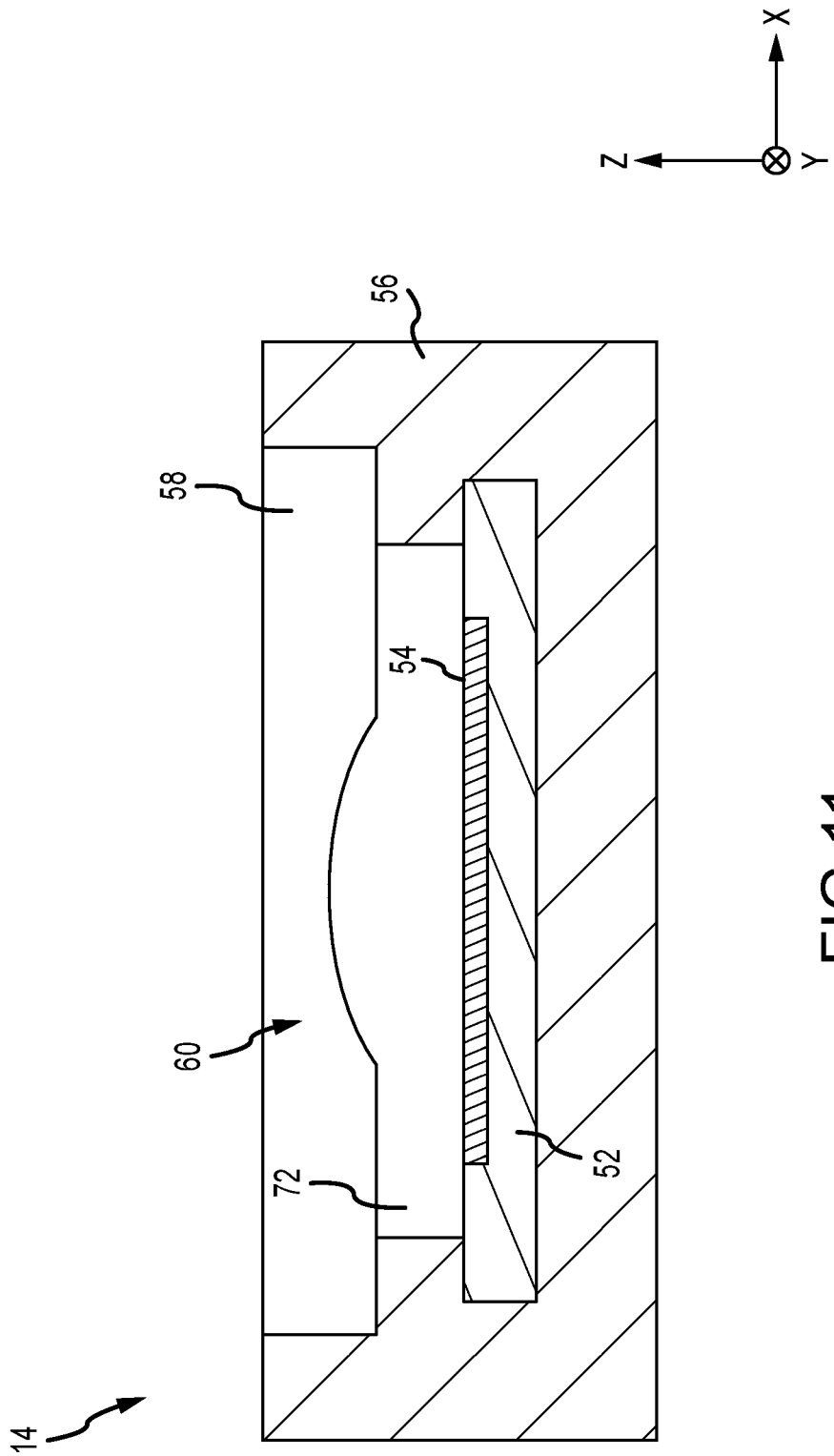
FIG. 11 is a cross-sectional side view of an illustrative SPAD-based semiconductor device that includes a concave light spreading lens on a lower surface of a transparent cover in accordance with an embodiment.

A convex lens of the type shown in FIG. 9 may be used as the light spreading lens in FIG. 8B or FIG. 8C if desired. A light spreading lens may also be incorporated into the lower surface of glass layer 58 if desired. For example, a convex light spreading lens 60 may protrude from a lower surface of glass layer 58 as in FIG. 10 or a concave light spreading lens may be formed as a recess in the lower surface of glass layer 58 as in FIG. 11. Just as the lower surface of glass layer 58 is planar in FIGS. 7 and 9, the upper surface of glass layer 58 may be planar in the event that the light spreading lens is formed on the lower surface of glass layer 58 (as in FIGS. 10 and 11). Glass layer 58 may also have lenses on both the upper and lower surfaces if desired. In general, any lens design that spreads the incident light to a larger area may be used as the light spreading lens in FIG. 8B or FIG. 8C.

The foregoing is merely illustrative of the principles of this invention and various modifications can be made by those skilled in the art. The foregoing embodiments may be implemented individually or in any combination.

What is claimed is:

1. A semiconductor device comprising:
   a semiconductor substrate that includes a plurality of single-photon avalanche diodes;
   a glass layer that covers the semiconductor substrate; and
   a groove in the glass layer that overlaps the plurality of single-photon avalanche diodes, wherein the groove receives incident light distributed across a first width and spreads the light to be distributed across a second width at the plurality of single-photon avalanche diodes and wherein the second width is greater than the first width.

2. The semiconductor device defined in claim 1, wherein the groove has a concave cross-section and is formed in an upper surface of the glass layer.

3. The semiconductor device defined in claim 1, wherein the groove has a width and a length that is longer than the width and wherein the groove has a uniform cross-section along the length.

4. The semiconductor device defined in claim 1, further comprising:
   an array of microlenses, wherein each microlens is formed over a respective single-photon avalanche diode.

5. The semiconductor device defined in claim 1, wherein the semiconductor substrate and the glass layer are separated by an air gap.

6. The semiconductor device defined in claim 1, wherein the glass layer has first and second opposing surfaces, wherein the second surface is interposed between the first surface and the semiconductor substrate, and wherein the groove is formed in the first surface.

7. The semiconductor device defined in claim 6, wherein the semiconductor substrate and the glass layer are separated by an air-filled gap.

8. The semiconductor device defined in claim 1, wherein the plurality of single-photon avalanche diodes is arranged in a line.

9. A semiconductor device comprising:
   a semiconductor substrate that includes a plurality of single-photon avalanche diodes;
   a glass layer that covers the semiconductor substrate; and
   a groove in the glass layer that overlaps the plurality of single-photon avalanche diodes, wherein the plurality of single-photon avalanche diodes is arranged in a line and wherein the groove extends parallel to the line.

10. The semiconductor device defined in claim 1, wherein the groove spreads the light along a first dimension without spreading the light along a second dimension that is perpendicular to the first dimension.

11. A semiconductor device comprising:
    a semiconductor substrate that includes a plurality of single-photon avalanche diodes;
    a glass layer that covers the semiconductor substrate; and
    a groove in the glass layer that overlaps the plurality of single-photon avalanche diodes, wherein the groove is formed in a planar surface of the glass layer.

12. The semiconductor device defined in claim 11, wherein the groove receives incident light distributed across a third width and spreads the light to be distributed across a fourth width at the plurality of single-photon avalanche diodes and wherein the fourth width is greater than the third width.

13. The semiconductor device defined in claim 11, wherein the groove has a width and a length that is longer than the width.

14. The semiconductor device defined in claim 13, wherein the groove has a uniform cross-section along the length.

15. The semiconductor device defined in claim 11, wherein the plurality of single-photon avalanche diodes is arranged in a line and wherein the groove extends parallel to the line.

16. The semiconductor device defined in claim 11, wherein the glass layer has a first width and wherein the groove has a second width that is less than the first width.

17. The semiconductor device defined in claim 9, wherein the groove receives incident light distributed across a first width and spreads the light to be distributed across a second width at the plurality of single-photon avalanche diodes and wherein the second width is greater than the first width.

18. The semiconductor device defined in claim 9, wherein the groove has a width and a length that is longer than the width and wherein the groove has a uniform cross-section along the length.

19. The semiconductor device defined in claim 9, wherein the groove is formed in a planar surface of the glass layer.

20. The semiconductor device defined in claim 19, wherein the glass layer has a first width and wherein the groove has a second width that is less than the first width.

* * * * *